(12) United States Patent
Cain et al.

(10) Patent No.: US 6,219,656 B1
(45) Date of Patent: Apr. 17, 2001

(54) MEMORY INTEGRITY FOR METERS

(75) Inventors: Brent Cain, Pickens; Brad Smith, Seneca, both of SC (US); Gary Morand, Duluth, GA (US)

(73) Assignee: Schlumberger Resource Management Services, Inc., Norcross, GA (US)

( * ) Notice: Subject to any disclaimer, the term of this patent is extended or adjusted under 35 U.S.C. 154(b) by 0 days.

(21) Appl. No.: 09/448,195

(22) Filed: Nov. 23, 1999

Related U.S. Application Data (60) Provisional application No. 60/109,906, filed on Nov. 25, 1998.

(51) Int. Cl.[7] ................................................. G06F 17/60
(52) U.S. Cl. ........................ 705/412; 705/400; 714/6
(58) Field of Search ..................... 702/57, 60, 61; 705/400, 404, 405, 412, 413; 714/1, 5, 6, 100

(56) References Cited

U.S. PATENT DOCUMENTS

| | | | |
|---|---|---|---|
| 4,422,067 | * 12/1983 | Clark et al. ........................... | 340/508 |
| 4,481,604 | * 11/1984 | Gilham et al. ....................... | 705/408 |
| 4,509,128 | * 4/1985 | Coppola et al. ...................... | 702/61 |
| 4,783,623 | * 11/1988 | Edwards et al. ..................... | 324/156 |
| 4,922,456 | * 5/1990 | Naddor et al. ................... | 365/185.24 |
| 5,021,963 | * 6/1991 | Brown et al. ........................ | 705/405 |
| 5,029,093 | * 7/1991 | Wiener ................................. | 705/405 |
| 5,029,163 | * 7/1991 | Chao et al. .......................... | 370/458 |
| 5,469,049 | * 11/1995 | Briese et al. ...................... | 324/76.77 |
| 5,495,447 | * 2/1996 | Butler et al. ........................ | 365/200 |
| 5,528,661 | * 6/1996 | Siu et al. .............................. | 379/27 |
| 5,553,231 | * 9/1996 | Papenberg et al. ..................... | 714/5 |
| 5,602,857 | * 2/1997 | Zook et al. ........................... | 714/769 |
| 5,764,577 | * 6/1998 | Johnston et al. ..................... | 365/200 |

FOREIGN PATENT DOCUMENTS 5-20880 * 1/1993 (JP) .

OTHER PUBLICATIONS

"HHB Systems Introduces New ASIC Test Generation System"; News Release, Jun. 6, 1988, p. 1.*

* cited by examiner

*Primary Examiner*—Edward R. Cosimano
(74) *Attorney, Agent, or Firm*—Dority & Manning, P.A.

(57) ABSTRACT

An improved process ensures to the extent possible that the usage memory of an electronically-based electricity meter is always in a state that most recent data may be retrieved. Two separate areas or pages of memory are maintained and updated as to quantitative consumptions, e.g., kiloWatt-hour. Preferably a non-volatile form of memory is used. The older of the two data memories is updated, based on a data validation check. The approach ensures that a previous value is always retained, to prevent full data loss in the event that the power goes down. If one area of memory becomes corrupted, the other value can be retrieved and verified so as to prevent loss of both memory areas, before a subsequent data reading (such as kWh or a unit of time for a kW reading). Use of a relatively smaller unit of measure prevents any significant adverse affects to the accuracy of the value stored. In other words, the maximum data lost is limited to the chosen unit of measure since the most recent previous update.

41 Claims, 6 Drawing Sheets

MEMORY INTEGRITY FOR METERS

PRIORITY CLAIM

Priority is hereby claimed to prior filed provisional application with the same title and same indicated inventorship as presently presented, filed on Nov. 25, 1998 and assigned U.S. Ser. No. 60/109,906.

BACKGROUND OF THE INVENTION

The present invention generally concerns improved processes or techniques for ensuring the integrity of meters during power outages, and more particularly concerns improved memory integrity of electricity meters such that the memory is always in a state that previous data may be retrieved. The subject invention concerns both apparatus and methodology in such areas, including the use of practical computer software applications involving an algorithm approach to producing a useful, concrete and tangible result, i.e., namely, a stored data value for consumed electricity (or other commodity) to be charged to a customer's account.

The general object of metrology (i.e., the science of measurement) is to monitor a physical phenomenon to permit a record of the monitored event(s). If the potential to record the measured or monitored data is lost, then the entire basic purpose of the metering device and/or effort fails.

Such basic function and purpose of metering devices can be applied to a number of contexts. One broad area of measurement relates, for example, to utility meters. These may include the monitoring of consumption of a variety of forms of energy or other commodities, such as electricity, water, gas, and oil, to name a few.

Historically, a mechanical form of register was used for utility meters. Such an approach provided a relatively dependable field device with certain inherent functional advantages. For example, if the flow of the consumable commodity being measured was interrupted, the mechanical form of gauge simply stopped in its place, automatically reflecting the previous accumulation without other arrangements being required, and without any loss of such accumulated data. After resumption of the flow of the commodity, the mechanical register could then simply begin to add additional flow values to the previous accumulation, so that accurate data was reflected at all times regardless of intermittent commodity flow interruptions.

Also, in many instances, the gauge or register required no separate power supply since it was operated directly by the commodity flow. In the case of electricity meters, the mechanical register could be electrically powered. Hence, when power was lost, the measurement function was temporarily moot so no measurement functionality was lost even though the gauge itself would be temporarily without power.

As the technology of metering devices progressed, mechanical registers began to be replaced with more electrical-based devices and electronic forms of registers. Generally speaking, all such devices require some form of electrical power for their operation and data storage function. Such fact created the potential for catastrophic loss of accumulated data (i.e., the failure of the entire purpose of the measuring device if data representing accumulated commodity usage were lost).

For example, in the case of an electricity meter, electric power is already flowing to (and through) the metering or measuring device. Such fact makes for a convenient supply of electricity, without having to attempt to rely on battery operation or some other source of electrical power. However, such an arrangement, while advantageous in certain aspects, is inherently susceptible to the loss of electrical power to the measuring device (including its register) at the same time there is any power loss to the customer's location (for example, house or business).

Intermittent power outages (or other conditions, such as brown outs) can occur in even the best maintained systems. For example, an electrical power system can become damaged due to storm debris (e.g., falling limbs) or high winds, or from an accident (for example, vehicles such as trucks or cars knocking down utility poles and power lines). Under certain load shedding conditions, it may even become necessary for power to a given location to be deliberately interrupted.

Regardless of such causes (or possibly other sources) of power outages, the inherent problem is that an electrical measuring device with an electrically powered register may lose its accumulated data in the event of a routine power outage. Prior attempts have been made to address such technical problem.

In one instance, a technique or storage algorithm was used to store electricity meter quantities to a non-volatile memory whenever a power outage occurred. In such prior attempt, the technique involved a relatively early detection of the power outage and consideration of the power supply hold up times to complete the storage of the electricity meter quantities to the non-volatile memory. Such so-called "hold up time" refers to the amount of time a supply will maintain acceptable output power to the circuit after line voltage is removed. Hence, such technique involved the use of relatively complicated and costly power fail detection circuits and power supply hold up components. In addition, most non-volatile memory devices are limited by the maximum number of times an area of memory could be written to over the life of such a device.

Other arrangements and aspects of electronic-based electricity meters are known. See, for example, disclosures set forth in U.S. Pat. Nos. 4,783,623; 5,469,049 and 4,509,128. The disclosures of all such patents are hereby incorporated herein by reference.

SUMMARY OF THE INVENTION

The present invention recognizes and addresses variations of the foregoing problems, and others, concerning metrology operations. Thus, broadly speaking, a principal object of this invention is improved metrology operations. More particularly, a main concern is improved measurement integrity through preservation of data despite intermittent power outages.

Another more particular object of the present invention is to provide improved apparatus and methodology for memory integrity for electricity meters. In such context, it is a general object to provide for improved integrity of stored electricity meter quantities including, but not limited to, such items as either energy or demand usage. In such context, it is desired to facilitate the measurement of, for example, certain units of energy for a kiloWatt-hour (kWh) reading or, with reference to units of time for a kilowatt (kW) reading.

Still another general object of the present invention is to provide a practical application of computer software for producing a useful, concrete and tangible result, namely, improved memory integrity of metrology results, such as obtained with utility meters, particularly such as electricity meters. In such particular context, it is a present object to remove the need to employ relatively complicated and costly power failure detection circuits and power supply hold up components.

In the context of electricity meters, it is another present object to make use of a dual storage technique or algorithm so as to assure there will always be a previous electricity meter value retained, thus preventing full energy loss at power down. In such context, it is a further object to limit the loss of any electricity meter quantity information to a chosen unit of measurement, selected so as to be small enough not to significantly affect the accuracy of a value being stored.

It is yet another object of the present invention to provide improved metrology technology which makes improved use of non-volatile memory devices, but without requiring additional circuits for direct fault detection or other arrangements to provide for use of the non-volatile memory.

It is another general object of the present invention to provide an apparatus and improved technology which may be advantageously implemented through, and with the assistance of, specific computer software for implementing a memory integrity algorithm for double buffering the stored data involved by maintaining and updating two separate areas of memory for quantities stored, such as electricity meter quantities. Additional objects and advantages of the invention are set forth in, or will be apparent to those of ordinary skill in the art from, the detailed description herein. Also, it should be further appreciated that the modifications and variations to the specifically illustrated, referenced, and discussed features and steps hereof may be practiced in various embodiments and uses of this invention without departing from the spirit and scope thereof, by virtue of present reference thereto. Such variations may include, but are not limited to, substitution of equivalent means and features or steps for those shown, referenced, or discussed, and the functional, operational, or positional reversal of various parts, features, steps, or the like.

Still further, it is to be understood that different embodiments, as well as different presently preferred embodiments, of this invention may include various combinations or configurations of presently disclosed steps or features, or their equivalents (including combinations of steps or features or configurations thereof not expressly referenced in the figures or stated in the detailed description).

One exemplary present embodiment of the subject invention relates to improved memory integrity making use of a double buffered process of maintaining and updating two areas of memory for quantity stored data, such as for electricity meters. One area holds a most recent reading while the other holds a prior reading. In accordance with such technique or algorithm, the older of such two memories is updated. Practice of such an arrangement and/or technique advantageously permits, for example, an electricity meter, to maintain any quantity, such as an increasing register kWh (kiloWatt-hour) reading in a fault tolerant environment.

Other present exemplary embodiments of the subject invention may make use of various memory types, such as non-volatile technology devices. Such devices may include, for example, EEPROM (Electrically Erasable Programmable Read-Only Memories) FLASH memory devices, magnetic media, or battery backed RAM (Random Access Memory). As another aspect of the subject invention, any of such non-volatile technology memory devices may be located either internally or externally to the processing device.

In accordance with the subject invention, each such memory device would be utilized so as to constitute double buffered areas, with each buffer having its own checksum value. Such a checksum is a method used to validate data that is transmitted to and from a processing device and its storage media (which, as referenced, may be varied in accordance with the subject invention). Using a dual storage algorithm or technique in accordance with the subject invention assures that a previous value is always retained, thereby preventing full energy loss during any power outage.

Further in accordance with exemplary embodiments of the present invention, only one of the at least dual areas (i.e., the older value) is updated to a new value at any one time. In such fashion, in the event one of the areas becomes corrupted, the other value can be retrieved and verified to avoid the possibility of any corruption having a catastrophic effect, which would be constituted by the loss of both memory areas.

In still further aspects of the subject invention, the present technique or algorithm manages and oversees the memory write operation so as to coincide (in the instance of an electricity meter) with a certain unit of energy for a kWh reading or unit of time for a kW reading. In accordance with the subject invention, the unit of measure is chosen so as to be small enough that it will not significantly affect the accuracy of the value being stored in the event that the attempted storing (i.e., memory write operation) fails. At the same time it is chosen so as not to be so small as to exceed (cumulatively) the service life of the non-volatile memory device. Such is a concern, for example, in the case of EEPROM devices, which have a limited number of times that a memory location may be written.

In accordance with the subject invention, the storing technique or algorithm is not triggered by any power outage, so the need to have the warning of a power failure is removed entirely from the system.

In still further embodiments involving the subject technique or algorithm, a write operation to a non-volatile memory can be allowed to fail without entirely defeating the metrology basic function involved. In such event, in accordance with the subject invention, the maximum data lost is the preselected unit of measure since the most recent (i.e., previous) update. For example, if there is a power failure as the process is being operated for replacing the older energy value stored, then the write operation would fail. Upon the return of power, such attempted update of the older value would be found to have a bad checksum. In such instance, in accordance with the subject technique or algorithm, the most recently successfully stored energy value would be returned. Hence, the lost amount of energy (i.e., data about such energy) during the interim would only be the managed incremental unit of energy (i.e., data about such energy).

It is to be understood by those of ordinary skill in the art that the subject invention involves both apparatus implementing such techniques and the computer software or other implementations of flow charts and/or algorithms as involved with the subject invention, for constituting a practical application of such techniques or algorithms for producing a useful, concrete and tangible result.

Those of ordinary skill in the art will better appreciate the features and aspects of such embodiments and techniques, and others, upon review of the remainder of the specification.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Repeat use of reference characters throughout the present specification and appended drawings is intended to represent same or analogous features, elements, or steps of the invention. Use of certain numbers in the figures are intended to represent data values, events, or locations, rather than specific reference characters, as otherwise discussed in detail throughout the specification. The meaning of the indicated numbers will be clear in context to one of ordinary skill in the art, taken together with the corresponding description thereof in the specification.

DETAILED DESCRIPTION OF THE PREFERRED EMBODIMENTS

Those of ordinary skill in the art will appreciate that various modifications may be made to the specific examples and embodiments discussed herein, and that the subject invention is not intended as being limited by such specific examples. Moreover, the description of such specific examples is intended by way of example only, rather than limitation, such that the above-referenced variations within the spirit and scope of the invention may be practiced.

Further referencing present exemplary embodiments, it is to be understood that the subject invention involves use of a double buffering technique or algorithm for maintaining and updating two areas of memory for quantity stored. Preferably, such quantities may involve electricity meter quantities of various types (as referenced above) when used in conjunction with electric utility meters. Other embodiments of the subject invention may be practiced with other forms of meters and adapted for use therewith, including various utility meters of the types as referenced above.

In conjunction with maintaining and updating two areas of memory for quantity stored, one area holds the most recent reading while the other holds a prior reading. In accordance with the subject invention, the older of such two recorded areas is sequentially updated.

As referenced above, various memory types may be used, preferably of any non-volatile technology such as EEPROM, FLASH memory devices, magnetic media, or battery backed RAM, located either internally or externally to the metering device (specifically, the processing device portion thereof). A checksum methodology is used to validate data, with each of the double buffered areas having its own checksum value. The data being validated is that being transmitted to and from a processing device and its storage media, whatever form is practiced by one of ordinary skill in the art in accordance with an embodiment of the subject invention. Use of the present dual storage algorithm or process ensures that there will always be a previous value retained, so as to prevent full energy loss at power down. Since only one of the dual areas (i.e., the older value) is updated to a new value at any one time, the other value can be retrieved if it is found that the one area being then updated is corrupted. If the other value is retrieved and verified, it avoids the possibility of a corruption having a catastrophic effect, i.e., the loss of both memory areas.

When in accordance with the subject invention, the unit of measurement is chosen to be small enough so as to not significantly affect the accuracy of the value being stored, the lost amount of energy (i.e., data about such energy) will in the worst case be only such managed incremental unit of energy. Such will occur only in the event the attempted storing (i.e., write operation) fails. The selected unit of measure is in accordance with the subject invention not so small as to exceed the service life of the non-volatile memory device.

Referring more specifically to present exemplary embodiments, using a dual storage process, technique, or algorithm in accordance with the subject invention makes certain that there will always be a previous value retained, so as to prevent a full data loss during any power outage. In general, a power outage may occur during the storage of either the first or second stored value in accordance with the subject invention. Upon ultimate restoration of power, both values in the two non-volatile memory areas may be tested to determine if neither, either, or both values are correct.

In accordance with the subject invention, if one of the tested values is higher than the other, than the higher value is regarded as the most recent accumulation. This is based on an assumption that a meter is in the power consumption mode, and that it is not running "backwards" because the normally consuming customer is instead, such as through use of a generator, putting energy back onto the power grid. In accordance with the subject invention, the lesser of the two data values (based on such assumption) can be discarded and updated with the next new value since such area of memory is regarded as containing the older of the two values.

In the context of the subject invention, such a storage unit or area of memory may be alternatively referred to or envisioned as a "page" of memory or simply as a "page."

A variety of reasons can cause failure of good values to be written to a non-volatile memory or to be read from such a memory. For example, loss of power can occur during a write operation to memory such that the write operation is not able to be completed before the power is completely gone. Another possibility is that noise can occur during a read or write operation. Still another potential reason for failure is simply failure of involved hardware. Yet another failure potential is simply failure of one of the areas or "pages" of the double storage area. Practice of the subject invention involves attempting to recover stored values in the presence of any such failures.

Generally speaking in accordance with the subject invention, with either a read or write operation, both areas or pages of the double storage area are read and their corresponding respective checksum values are calculated. The following Table 1 specifies in accordance with the subject invention the resulting potential outcomes of checksum errors and the corresponding actions to be taken per the invention.

TABLE 1

|  | Page 2 | |
| --- | --- | --- |
| Page 1 | Checksum good | Checksum bad |
| Checksum good | Checksum errors = 0 update oldest value | Checksum errors = 1 update both values |
| Checksum bad | Chesksum errors = 1 update both values | Checksum errors = 2 update both values |

As expressed in Table 1, the number of checksum errors is used to indicate the validity of the data involved and/or to specify additional action to be taken in accordance with the subject invention. For example, as a result of a write operation, any checksum error occurring whatsoever could call for a second write operation to take place in order to ensure successful storage of the corresponding data.

In other words, in Table 1, where checksum is indicated as "bad" or where the number of checksum errors is indicated as equaling 1, results in a second write operation as referenced above.

In the event of two checksum errors (i.e., checksum errors=2), the results may be indicating loss of any stored value whatsoever. In such event, it may be impossible to recover any data in the event of a loss of power. However, in this portion of the technique or algorithm, no actual loss of power may have yet occurred. Until such time, the data may be valid. As a result, the occurrence of such a condition (i.e., two checksum errors) could be used to flag a particular measuring unit or processing device for scheduled maintenance.

With a read operation, one checksum error could indicate a loss of one unit of measurement, as referenced above. However, the occurrence of two checksum errors would indicate a complete loss of stored data and cause a non-recoverable error.

Figure 1:
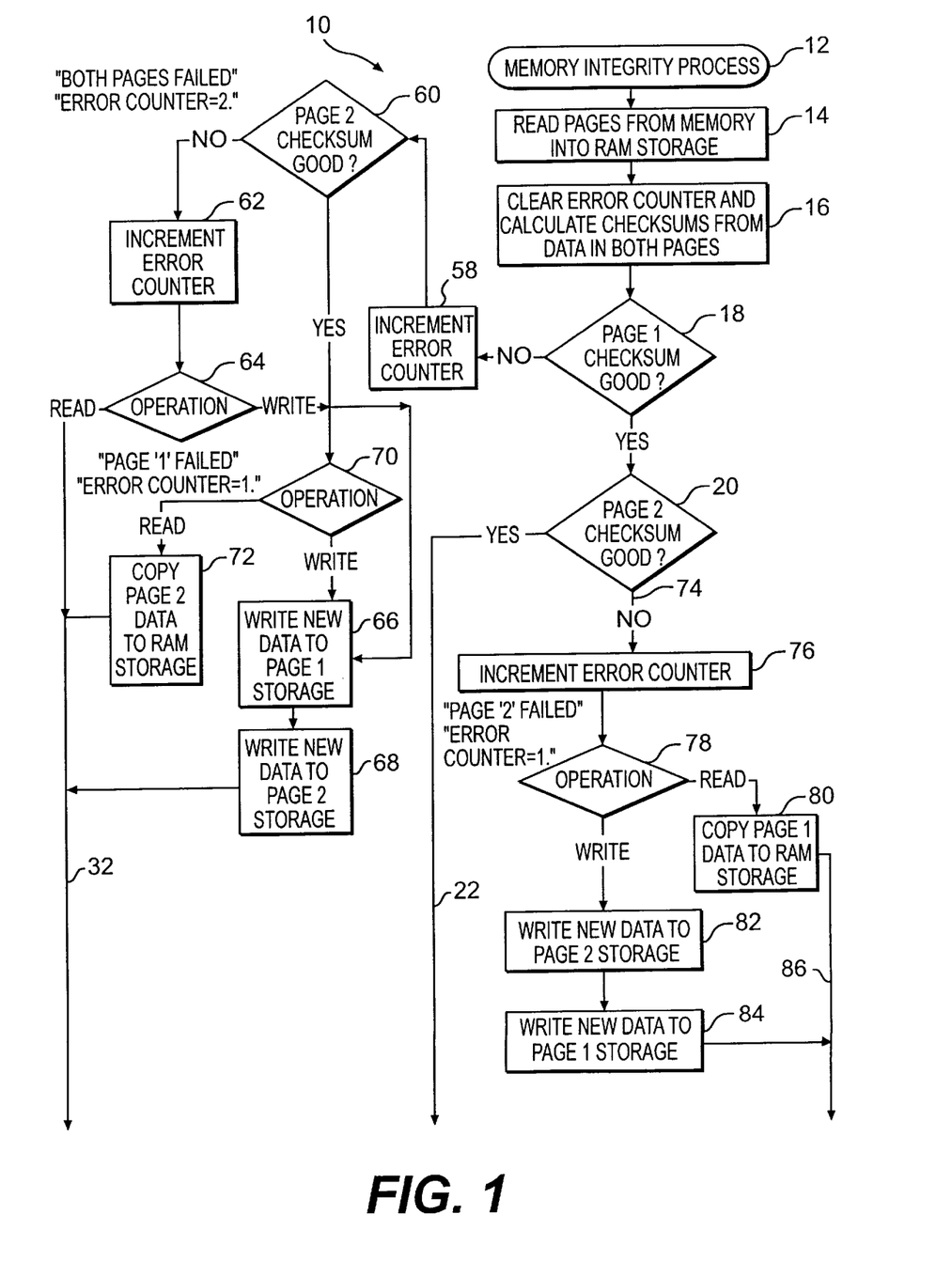
FIG. 1 is a flow chart representation of exemplary embodiments of memory integrity processes in accordance with the subject invention.

FIG. 1 is a flow chart overview of a memory integrity process or algorithm generally 10 in accordance with the subject invention. Referring to such flow chart explains in great detail operations and functions of exemplary embodiments in accordance with the subject invention and the memory integrity process and algorithm inherently described and defined throughout such flow chart of FIG. 1.

Those of ordinary skill in the art will understand and appreciate that at least a portion of such process or algorithm 10 in accordance with the subject invention involves operation thereof after power restoration after a power outage. For purposes of the present example, it is to be understood that practice of the subject invention is applied to an electricity meter. It is to be likewise understood that variations and modifications of the subject invention may be adapted and applied to other forms of utility meters, and to other types of meters.

After start-up of such process 10 as per step 12, both pages (i.e., Page 1 and Page 2) of data (for example, electricity meter quantities) are read into temporary storage for calculating checksums, per step 14. As part of such phase of operations of the process, an error counter is cleared and the checksums are calculated from the data entries in both pages, per step 16.

As a next step or operation of such phase of process 10, the checksums are reviewed (i.e., compared) to determine data validity of both such pages, Page 1 and Page 2, per respective steps 18 and 20. As illustrated per the flow chart of overall process 10, various different branches are involved depending on what combination of results are involved with checking the validity of the data for both Page 1 and Page 2.

In the instance where both pages are determined to be valid, the subject exemplary process continues along flow line 22 to a determining operation 24. At least at the point of entering decisional operation 24, it has been determined that both Page 1 and Page 2 are passed, meaning that the error counter equals zero. Such operation 24 determines whether a read operation or write operation is taking place. If a read operation is taking place, control flows to a further decisional operation 26, as shown in present FIG. 1. The functional purpose of decisional operation 26 is to determine whether Page 1 or Page 2 is the more recent value (based on the assumption of an increasing data register). As referenced above, such determination is made by directly comparing the two data values for determining which is a higher value. If it is determined that Page 1 has the higher value, then a page update flag is set per step 28 (in this instance representing setting the value of such update flag to "1").

The result from step 28 of setting such page update flag to 1 is to direct the next write operation to the older of the two pages, which in this instance has been determined (based on the stated assumption) to be Page 1. In view of such result, such denominated Page 1 is then used to restore the active data value, per step 30, which means that the data from Page 1 is copied into a further location, such as RAM storage. From there, operation continues along flow line generally 32 for returning to the error counter (the flow line destination from a variety of different operations, as shown in FIG. 1).

If, on the other hand, the determination of decisional operation 26 is that Page 2 is the more recent data, the page update flag will be set to "0" per operational step 34.

To summarize, a page update flag of "1" means that Page 1 data is used during a write operation and a page update flag of "0" means that Page 2 data is used during a write operation.

In accordance with this exemplary embodiment of the subject invention, the page update flag is also set to 0 if it is determined that the data values of Pages 1 and 2 are equal. In this way, an affirmative or forward moving flow chart is provided for any possibility. It is to be understood by those of ordinary skill in the art that other arrangements could be practiced, in the event that the value of the data in Page 1 is determined to be equal to that within Page 2.

Regardless of whether the Page 1 stored data values were found to be less than the Page 2 stored data values or equal thereto, the present exemplary embodiment of the subject invention per the flow chart of FIG. 1 results in the data in the denominated Page 2 being copied to the alternative storage site, i.e., a RAM storage, per the operation of step 36. Subsequent operation again proceeds via flow line 32 from step 36, as referenced above.

Returning to decisional operation step 24, the following more specifically traces function of exemplary embodiments of the subject invention per FIG. 1 in the event that a storing data operation (i.e., a "write" operation) is taking place.

Referring to such point in FIG. 1, it has already been determined that both Pages 1 and 2 hold valid data. Proceeding along flow line 38 in view of a write operation being conducted, a page update flag operation or arrangement is utilized in accordance with the subject process or algorithm to toggle write operations between Page 1 or Page 2.

It is to be understood that, per preferred operation, a read is performed after a power up. As shown in alternative operational steps 28 and 34, such operation results in the page update flag being re-initialized to either a "1" or "0" value.

Specifically, decisional operation step 40 causes an examination of the above-referenced page update flag. When such flag is set to "0" (see step 34 and its corresponding description), operation branches to a further decisional branch operation generally 42. If the page update flag is set to "1" (see operational step 28 and its corresponding discussion), operation proceeds to a further decisional operation step generally 44.

Both operational steps 42 and 44 examine their respective data information to determine whether a rollover or reset condition exists. Such a condition exists whenever the new data to be written is less than or equal to the value of the data sums in the respective pages (Page 1 for operational step 42 and Page 2 for operational step 44). If the decisional process of operational step 42 results in an affirmative or positive result, then the new data is written into Page 2 storage per Step 46. If the answer is negative, then such new data is written to the Page 1 storage per step 48.

Operational step 44 works just the reverse to that of operational step 42, though testing for the same question (i.e., whether a roll over or reset condition exists). If there is an affirmative response, then the new data is written to the Page 1 storage, per step 50. If the answer is in the negative, then the new data is written to the Page 2 storage, per step 52. Once such steps are complete, the page update flag is toggled per step 54 and operation continues with return error counter step 56, just as referenced above in discussion with flow line 32.

Such operational steps or process resulting in the present algorithm, as to the storing data or "write" operation, maintains the most recent and prior data. It also inherently prevents consecutive write operations to a single page, thus extending the "write cycle" life of some memory devices such as EEPROM's.

It is to be understood by those of ordinary skill in the art that whenever a rollover or reset condition exists (i.e., the "yes" decisional branch for decisional operations 42 or 44), the new data is written to both Page 1 and Page 2 storage areas. This is to, in effect, start over with fresh or fully updated data in both page storage areas. The successive operations represented by paired steps 46 and 48 and paired steps 50 and 52 (involving indicated flow lines 49 and 53, respectively) represent such preferred mode of operation within process 10.

Overall operation of the process or algorithm generally 10 will result in returning the number of checksum errors encountered, per step 56. Very simply, as will be understood by those of ordinary skill in the art, a checksum "error" is determined whenever a calculated checksum is not equal to the stored checksum.

The number of possible checksum errors encountered can range anywhere from 0 to 2. Per such scale, 0 equates to no errors, "1" equates to one checksum error and "2" equates to both checksums being determined as erroneous.

In such instance of a returned value of "2", it may be determined that a fatal error has occurred, since data in both storage locations is determined to be invalid, based on the review of checksums per other operational steps in accordance with the process or algorithm generally 10. A return value of "1" may be handled by the subject process or algorithm as a non-fatal error because it has been determined and is known that one storage location still has valid data. The specific operations in accordance with the subject process or algorithm are discussed as follows.

Decisional branch or operational step 18 determines whether the Page 1 checksum is good. If the answer is affirmative, then the Page 2 checksum is evaluated per decisional operation step 20, as referenced above. However, if the answer is "no" when reviewing the Page 1 checksum (per branch 18), then the error counter is incremented per step 58. As a next operation, the Page 2 checksum is still evaluated, per a decisional branch or operational step 60. If the answer is no, then the error counter is incremented to two via step 62, meaning that both pages have failed, as referenced above.

When both pages have failed, both values need to be updated, in accordance with the subject invention (see Table 1 as referenced above). Therefore, indication of a read operation per decisional branch 64 results in no read being taken since no valid data is available. However, determination of a write operation per decisional branch 64 results in new data being written to both Page 1 storage and Page 2 storage, per the successive operational steps 66 and 68. Again, flow operation turns from such point to the flow line 32, referenced above.

On the other hand, an affirmative decision from decisional branch 60 indicates that at least one storage location still has valid data. In this instance it also specifically indicates that Page 2 is the location of such valid data. Therefore, the error counter is set at "1" because only Page 1 has failed.

Upon such status, when a decisional operational branch 70 is reached, any determined read operation results in an instructional step to copy Page 2 data to the RAM storage, per step 72. Such operational step takes place because the subject process or algorithm has determined that only Page 2 holds valid data.

In the event of a write operation being instructed as detected in decisional step 70, it is desirable to write the new data to both storage locations Page 1 and Page 2, since it is known that the Page 1 data is invalid and that it is also time to update the Page 2 data. Again, the successive write operations of steps 66 and 68 are implemented, and the process returns to flow line 32, as referenced above.

Flow line 74 represents a condition wherein it has been determined that the Page 1 data values are valid but that the Page 2 data values are not valid. Operation of a step 76 again results in the error counter being incremented. Because operation is proceeding on the "no" branch from decisional step 20, it is known not only that a single page has failed, and that Page 2 is the failed page. Therefore, decisional branch 78 operations are similar to (but reverse of) the resulting operations of decisional branch 70.

Specifically, a read instruction detected at decisional branch 78 results in data from Page 1 being copied to RAM storage, per step 80, since it has been determined that Page 1 is the page with the valid data. If a write operation is detected per decisional branch 78, then successive steps 82 and 84 result in new data being written to Page 2 storage and Page 1 storage, respectively. In any event, after operation of steps 80, 82, and 84, flow line 86 returns operation to return error counter step 56, similar to flow line 32, as referenced above.

Figure 2:
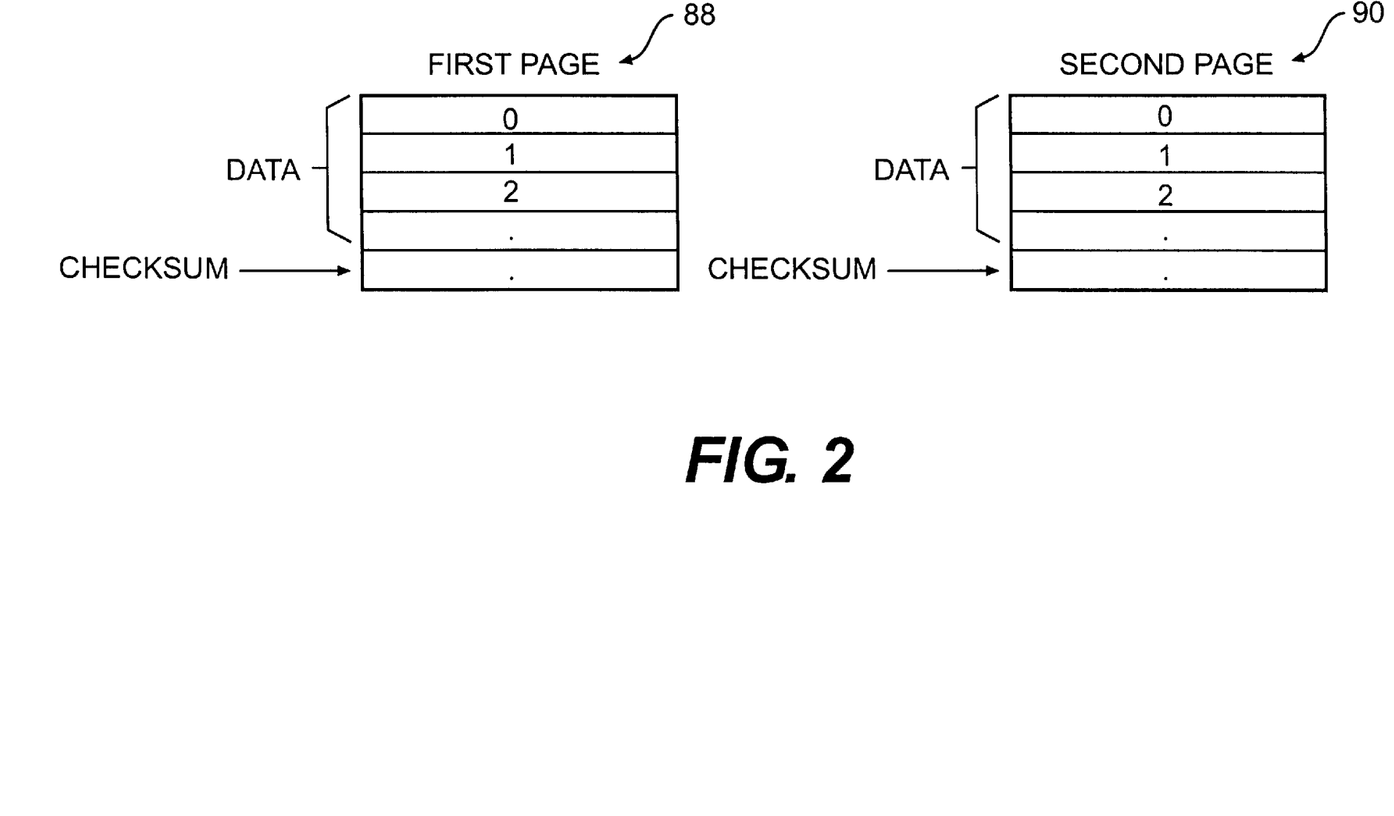
FIG. 2 is a schematic diagram representing techniques for double buffered data storage features in accordance with the subject invention.

FIG. 2 provides in diagrammatical or schematic format representations of features involving a pair of data pages as practiced in exemplary embodiments of the subject invention. Two respective pages generally 88 (First Page or Page 1) and 90 (Second Page or Page 2) are represented.

As referenced above, each storage block may be referred to as a page, with each page containing a predetermined number of storage elements (such as called bytes). As is known to those of ordinary skill in the art, some of the bytes within each page will contain the data to be stored and retrieved while one or more of such bytes may hold checksum information, as represented in FIG. 2. As further understood by those of ordinary skill in the art, the corresponding checksum value for stored data will be stored within the same page, i.e., the first or second page.

Figure 3:
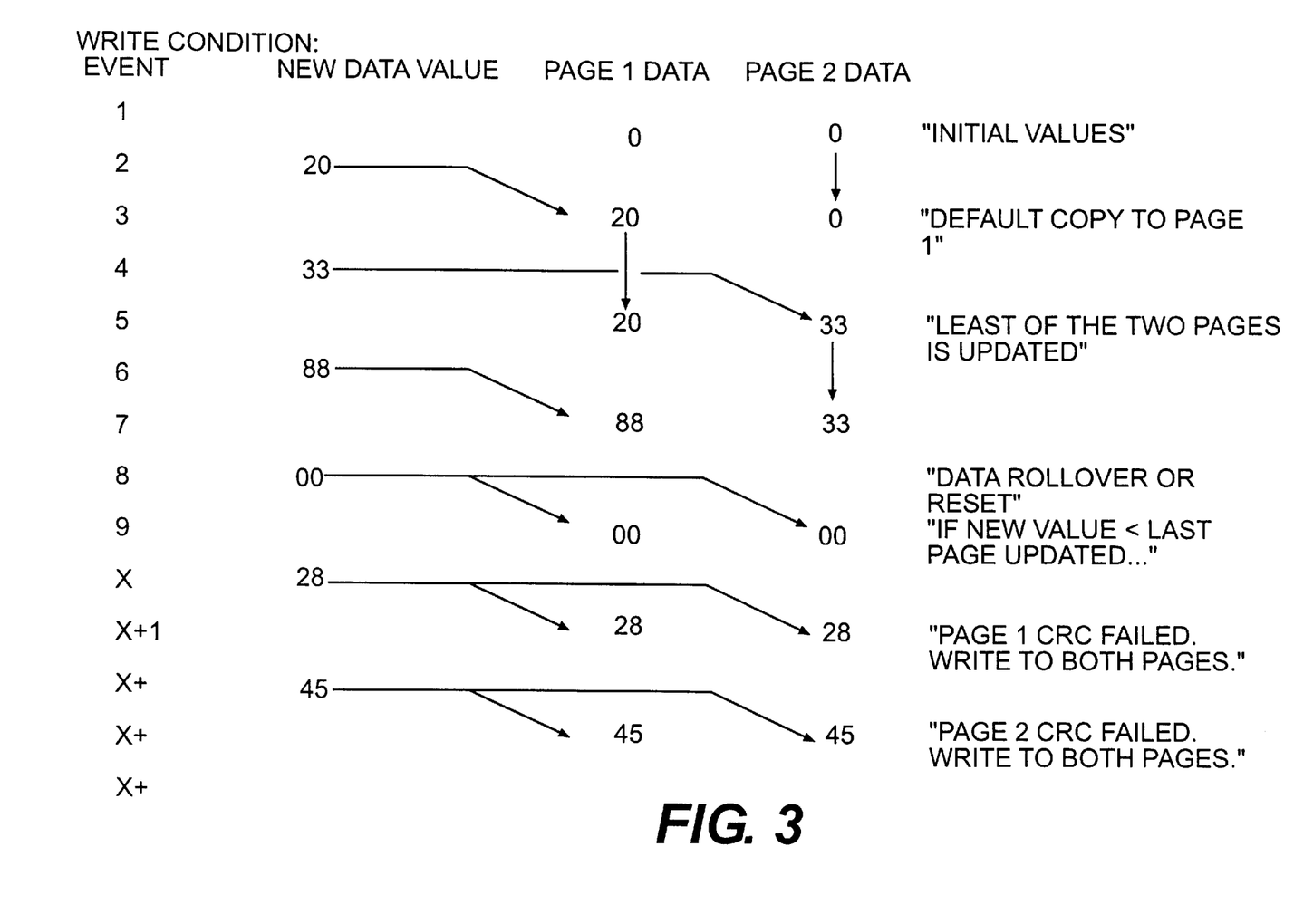
FIG. 3 is a sequence chart showing exemplary events in accordance with the subject invention during a data write condition.
Figure 4:
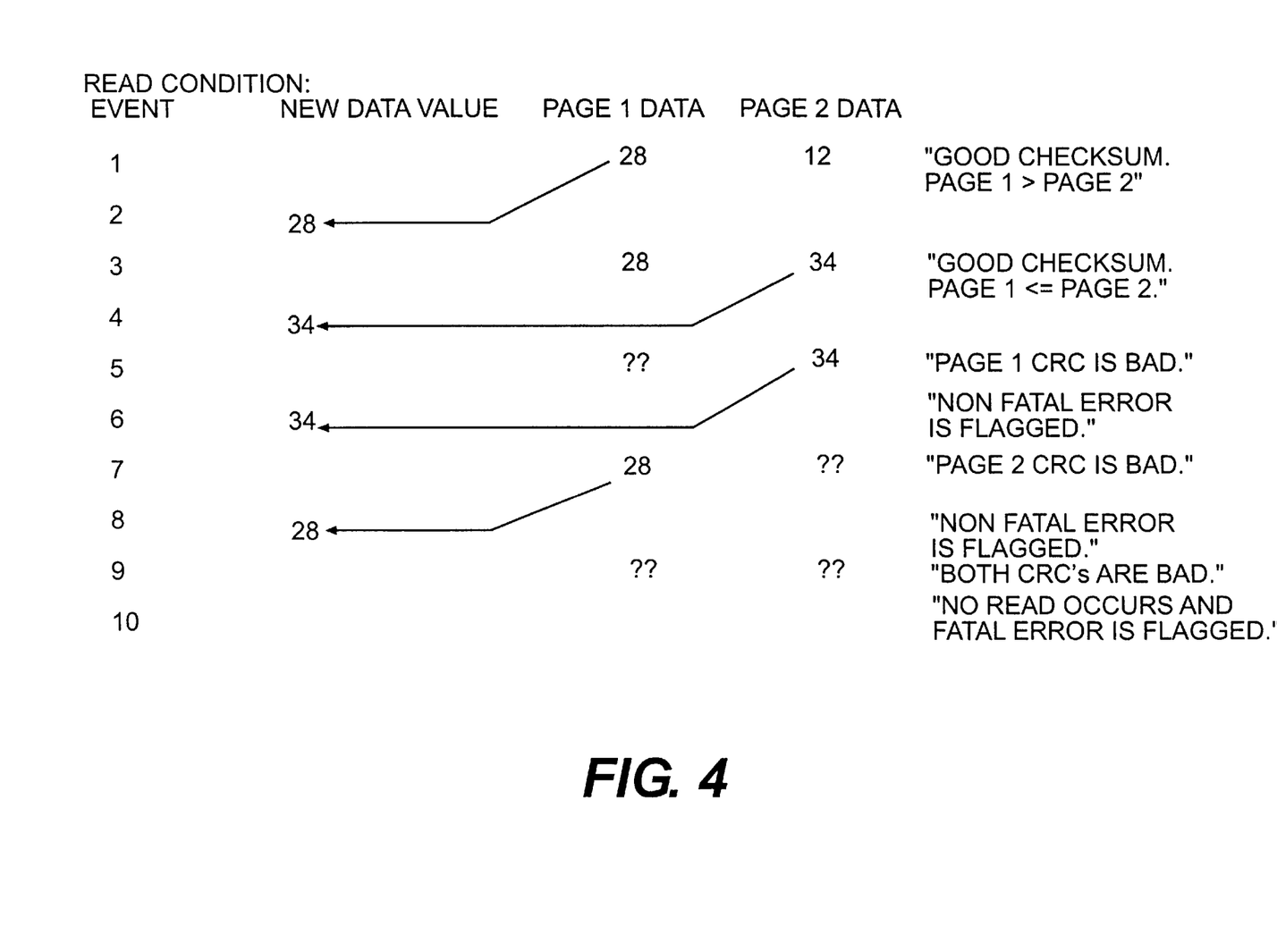
FIG. 4 is a sequence chart showing exemplary events in accordance with the subject invention during a data read condition.

FIGS. 3 and 4 represent step by step examples of various write and read conditions, respectively, operating in accordance with the subject invention on exemplary sets of changing data values. In other words, FIGS. 3 and 4 provide sequenced examples of events showing how the memory integrity process or algorithm in accordance with the subject invention functions.

It should be understood that the numerals indicated in FIGS. 3 and 4 are not intended as reference characters, as referenced in present FIGS. 1 and 2. Instead, they represent discreet events or conditions, as discussed, and exemplary data values, whether new or stored data.

It should be further understood that the examples of FIGS. 3 and 4 do not necessarily represent operational conditions as would occur under successive steps as shown per the exemplary events. In other words, actual events could proceed in a different order or fashion than the examples shown.

FIG. 3 specifically represents an example of writing data to a non-volatile memory storage device. Generally speaking, Event 1 represents a factory initialized condition, wherein the data values are set to zero in both pages, along with the correct checksums therefor.

During operation data will begin to accumulate, such as representing electricity meter quantities (in examples practiced with electricity meters). Once a preselected increment (such as of time) is achieved, the sequence operates to update data in the exemplary non-volatile memory device. Such is represented by Event 2 in present FIG. 3. In such instance, the exemplary new data value (represented by "20") is copied to a default page since both pages are initially equal (i.e., both are zero). The actual write step of the new data value to the Page 1 data is represented as exemplary Event 3.

During a successive storage event, the page values will be tested so as to copy the new value to the smaller page value. In this example, the Page 2 data has persisted with the initial value zero. Hence, at exemplary Events 4 and 5, it is determined that Page 2 contains the lower value data, such that the exemplary further new data value ("33") is updated to the Page 2 data per Event 5. The Page 1 data, as illustrated, continues "downward" as yet unchanged through the exemplary sequence.

Such operational steps, procedures, or algorithm continues to function until either a data rollover or reset occurs, as represented by exemplary Event 8 of FIG. 3. In other words, the data rollover condition can occur whenever the meter has achieved the full available value represented by its register. A reset condition is often times triggered by a meter operator or reader at periodic points in the meter life, for a variety of potential maintenance or other reasons not directly related to the determination of data. For whatever reason, exemplary Event 8 of FIG. 3 represents the presentation of such a "new" rollover or reset condition data ("00").

Through operation of the process or algorithm described in detail with reference to present FIG. 1, such a reset or rollover condition is determined by the newer value being less than (or equal to) the last page as written to. In such instance, the exemplary new data value is then written to both pages, as represented by Event 9, wherein the data for Page 1 and Page 2 is set to the then new data value ("00). See also operational step pairs 46 and 48 and operational step pairs 50 and 52 of present FIG. 1, and their corresponding description.

FIG. 3 further represents that any page with a failed checksum will cause a write to occur to both pages. All such examples of such instances are represented by various Event X's. See, also, the comment descriptions in the right hand column of FIG. 3, showing in Event "X+1" that Page 1 CRC failed, so there is a write to both pages. Again in a subsequent example denominated as Event "X+", it is noted that Page 2 CRC failed, resulting in a write to both pages. In such exemplary embodiment, it is to be understood by those of ordinary skill in the art that the referenced "CRC" failure involves what is known as cyclic redundancy checksum, a method of checking data bits, a procedure known to those of ordinary skill in the art without discussion of additional detail, and forming no particular aspect of the subject invention. The CRC method disclosed herewith is strictly by way of example and does not in any way limit the broader aspects of the subject invention.

As a further aspect of exemplary embodiments of the present invention, it is to be understood that the checksum algorithm or process steps take place before the page comparisons so as to determine data corruption on the pages. In such manner, proper action can be taken to recover or to flag errors, all as referenced in detail within present FIG. 1 and its corresponding description.

FIG. 4 represents various examples of reading data from an exemplary non-volatile memory device. The examples follow various specifics represented in present FIG. 1 and the corresponding discussion associated therewith.

A checksum test is used together with a determination of the higher stored value of the two pages for deciding which value of data will be retrieved. As represented specifically by exemplary Event Nos. 1 through 4 of present FIG. 4, both a valid checksum test and a determination of the higher of the two page values result in an exemplary new data value being read out from either Page 1 or Page 2 data.

Specifically, in exemplary Event 1 of FIG. 4, after a good checksum is determined and after it is found that Page 1 data values are greater than those of Page 2, the exemplary Page 1 data ("28") is read into the new data value, per Event 2 of FIG. 4. In exemplary Event 3 of FIG. 4, again after a good checksum determination, if the data value of Page 1 is found to be equal to or less than that of Page 2 (see Event 3 of FIG. 4), then the exemplary data of Page 2 ("34") is read into the new data value (see Event 4 of FIG. 4).

Events 5 through 8 of FIG. 4 represent various exemplary operational determinations in accordance with the subject invention if a single invalid checksum is detected, which means that the other page is determined to have a good checksum. In such instance, as referenced above, the error value is set equal to "1" or is flagged, and the page corresponding with the good checksum value is used for reading purposes.

As referenced above, the juxtaposition of various respective examples as shown in FIG. 4 is not necessarily meant to indicate that operations in actual practice would occur in such sequence, beyond the context of the discussion and description in the present specification.

More specifically, Event 5 of FIG. 4 shows by example that the Page 1 CRC determination is found to be bad, resulting per Event 6 of FIG. 4 in the Page 2 data ("34") being brought forward as new data value from a read operation. In exemplary Event 7 of FIG. 4, the Page 2 CRC is determined to be bad, such that the value per the Page 1 data ("28") is brought into the new data value (see Event 8 of FIG. 4).

Events 9 and 10 of FIG. 4 represent a situation in which both checksums are determined to be invalid. In such instance, no read is made and an error value (a "fatal" error) of "2" may be flagged. As shown in Event 9 of FIG. 4 specifically (per the right hand column comment descriptions), both CRC determinations are found to be bad. Per Event 10 of FIG. 4, no read occurs and a fatal error is flagged.

Figure 5:
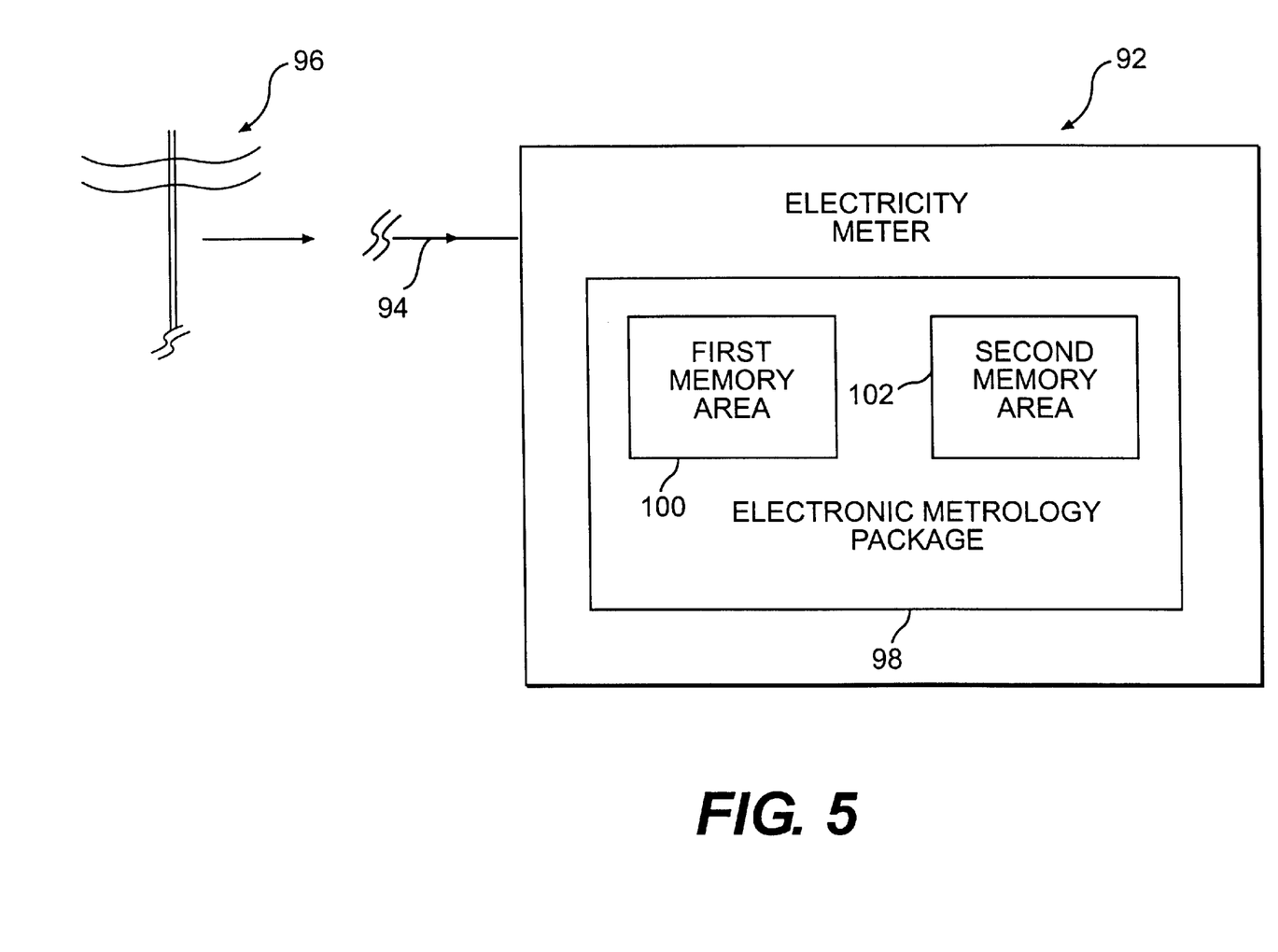
FIG. 5 is block diagram schematic overview of certain aspects of the subject invention.

FIG. 5 broadly represents in block diagram schematic form various hardware aspects of the subject invention (including various computer software and hardwired implementations thereof).

In the example of an electricity meter, such a meter or metering device generally 92 may receive power input generally 94 from a power grid or power distribution system represented by power lines generally 96. Otherwise incorporated within metering device 92 or associated therewith may be an electronic metrology package or processing device portion generally 98. As understood from the present disclosure, such processing device portion 98 may include or be associated with an electronic register for outputting electricity meter quantities. Such register may not be visible, because it may use an RF output or other form of output not requiring visualization at meter 92.

Further in accordance with the subject invention, a pair of memory areas 100 and 102, respectively, may comprise Page 1 and Page 2 double buffered storage elements for practicing the subject process or algorithm. Such two pages 100 and 102 are intended as representing all various forms of non-volatile memory storage devices referenced above and their equivalents. Hence, FIG. 5 shows in broad relationship a schematic of certain basic aspects in accordance with certain embodiments of the subject invention. Such broadly defined depiction is intended as representing variations in any implementation of the subject invention, as to content and use of computer software and/or hardware devices. Those of ordinary skill in the art would be able to formulate corresponding computer software (such as microprocessor executable) for implementing the FIG. 1 flowchart and its related discussion.

It is to be understood by those of ordinary skill in the art that the subject memory integrity process or algorithm may be practiced in various embodiments, including various mixtures of computer software implemented devices and hardwired devices. Those of ordinary skill in the art would be able to put into practice their own selected variations of computer software and hardwired implementations of the subject invention, based on the disclosure of this application (including specification and figures thereof). All such modifications and variations are intended to come within the spirit and scope of the present invention. Likewise, the foregoing presently preferred embodiments are exemplary only, and their attendant description is likewise by way of words of example rather than words of limitation.

What is claimed is:

1. A utility meter with improved memory integrity for preservation of consumption data regardless of intermittent power outages, comprising:

electronic metrology means for monitoring and sensing consumption of a utility commodity and for generating corresponding consumption data relative thereto in predetermined increments of measurement;

a pair of non-volatile memory storage devices operative in tandem as double buffered storage elements; and read/write logic for operating said memory storage devices in said predetermined increments of measurement such that valid consumption data is maintained if operatively possible in at least one of said non-volatile memory storage devices so that if consumption data becomes corrupted in the other of said non-volatile memory storage devices, only data corresponding with one of said predetermined increments of measurement will be lost, said maintenance of valid consumption data achieved by comparing values of consumption data in said memory storage devices and replacing any relatively lower determined value data with the next available new consumption data generated by said electronic metrology means.

2. A utility meter as in claim 1, wherein said read/write logic comprises a hardwired device operatively associated with said memory storage devices.

3. A utility meter as in claim 1, wherein said read/write logic comprises a programmable device and implementing associated software, collectively operatively associated with said memory storage devices.

4. A utility meter as in claim 1, wherein said utility commodity is electricity.

5. A utility meter as in claim 4, wherein said predetermined increments of measurement coincide with one of a certain unit of energy for a kWh reading and a unit of time for a kW reading.

6. A utility meter as in claim 1, wherein said memory storage devices each comprise one of an EEPROM, a FLASH memory device, a magnetic medium, and a battery backed RAM.

7. A utility meter as in claim 6, wherein said memory storage devices are located one of internally or externally to said electronic metrology means.

8. A utility meter as in claim 1, wherein said read/write logic is operative for monitoring for potential errors in checksum values associated respectively with consumption data stored in said memory storage devices.

9. A utility meter as in claim 8, wherein said read/write logic is operative for replacing the consumption data in both of said memory storage devices with the next available new consumption data generated by said electronic metrology means if at least one of said monitored checksum values is found to be in error.

10. A utility meter as in claim 1, wherein:

said memory storage devices comprise respective first and second pages of memory; and said read/write logic is operative for respectively determining potential checksum errors associated with each of said pages of memory and for replacing selected consumption data in each of said pages by updating same with the next available new consumption data generated by said electronic metrology means, with said updating being conducted according to the following logic table:

|  | Page 2 | |
| --- | --- | --- |
| Page 1 | Checksum good | Checksum bad |
| Checksum good | Checksum errors = 0 update oldest value | Checksum errors = 1 update both values |
| Checksum bad | Checksum errors = 1 update both values | Checksum errors = 2 update both values. |

11. A utility meter as in claim 10, wherein determining of two checksum errors by said read/write logic results in an indication of needed scheduled maintenance for said utility meter.

12. A utility meter as in claim 11, wherein said read/write logic is operative for retrieving consumption data on demand by first determining whether any checksum errors exist and then deciding which page has the higher value valid consumption data, and then retrieving such higher value valid data.

13. Methodology for operation of a utility meter to improve memory integrity thereof for preservation of consumption data regardless of intermittent power outages, comprising the steps of:
  providing electronic metrology means for monitoring and sensing consumption of a utility commodity and for generating corresponding consumption data relative thereto in predetermined increments of measurement;
  providing a pair of non-volatile memory storage devices operative in tandem as double buffered storage elements; and
  operating read/write logic for the memory storage devices in predetermined increments of measurement such that valid consumption data is maintained if operatively possible in at least one of the non-volatile memory storage devices so that if consumption data becomes corrupted in the other of the non-volatile memory storage devices, only data corresponding with one of the predetermined increments of measurement will be lost, said maintenance of valid consumtion data achieved by comparing values of consumption data in said memory storage devices and replacing any relatively lower determined value data with the next available new consumption data generated by said electronic metrology means.

14. Methodology for operation of a utility meter as in claim 13, wherein said utility commodity is electricity.

15. Methodology for operation of a utility meter as in claim 13, wherein the read/write logic comprises a hardwired device operatively associated with the memory storage devices.

16. Methodology for operation of a utility meter as in claim 13, wherein the read/write logic comprises a programmable device and implementing associated software, collectively operatively associated with the memory storage devices.

17. Methodology for operation of a utility meter as in claim 13, wherein said utility commodity is one of electricity, water, gas and oil.

18. Methodology for operation of a utility meter as in claim 14, wherein the predetermined increments of measurement coincide with one of a certain unit of energy for a kWh reading and a unit of time for a kW reading.

19. Methodology for operation of a utility meter as in claim 13, wherein the memory storage devices each comprise one of an EEPROM, a FLASH memory device, a magnetic medium, and a battery backed RAM.

20. Methodology for operation of a utility meter as in claim 19, wherein the memory storage devices are located one of internally or externally to the electronic metrology means.

21. Methodology for operation of a utility meter as in claim 13, wherein said read/write logic is operative for monitoring for potential errors in checksum values associated respectively with consumption data stored in said memory storage devices.

22. Methodology for operation of a utility meter as in claim 21, wherein the read/write logic is operative for replacing the consumption data in both of the memory storage devices with the next available new consumption data generated by the electronic metrology means if at least one of the monitored checksum values is found to be in error.

23. Methodology for operation of a utility meter as in claim 13, wherein:
  the memory storage devices comprise respective first and second pages of memory; and
  the read/write logic is operative for respectively determining potential checksum errors associated with each of such pages of memory and for replacing selected consumption data in each of such pages by updating same with the next available new consumption data generated by the electronic metrology means, with such updating being conducted according to the following logic table:

|  | Page 2 | |
| --- | --- | --- |
| Page 1 | Checksum good | Checksum bad |
| Checksum good | Checksum errors = 0 update oldest value | Checksum errors = 1 update both values |
| Checksum bad | Checksum errors = 1 update both values | Checksum errors = 2 update both values. |

24. Methodology for operation of a utility meter as in claim 23, wherein the read/write logic is operative when determining two checksum errors for indicating needed scheduled maintenance of the utility meter.

25. Methodology for operation of a utility meter as in claim 24, wherein the read/write logic is operative for retrieving consumption data on demand by first determining whether any checksum errors exist and then deciding which page has the higher value valid consumption data, and then retrieving such higher value valid data.

26. A process for helping to prevent a measuring apparatus with an electrically powered register device from losing accumulated usage data in the event of a power outage or anomaly, said process including:
  providing respective first and second memory devices operatively associated with such measuring apparatus; and
  using a dual storage double buffering technique operative with such memory devices in a chosen unit of measurement for selectively writing and reading usage data from the measuring apparatus relative to the memory devices, such that any usage data lost due to a power outage or anomaly is limited to an amount corresponding with a single one of the chosen units of measurement, and wherein said dual storage double buffering technique includes only updating with a new value at a time a determined older value of usage data stored in the respective memory devices.

27. A process for helping to prevent a measuring apparatus from losing accumulated usage data as in claim 26, wherein said dual storage double buffering technique includes conducting a checksum error test on stored usage data in each memory device and updating both of such memory devices at a time with a new value if at least one of the memory devices is shown to have corrupted data as indicated by a checksum error.

28. A process for helping to prevent a measuring apparatus from losing accumulated usage data as in claim 27, wherein said dual storage double buffering technique includes updating both of such memory devices at a time with a new value if one of a reset and rollover condition is indicated by such new value being equal to or less than the value of the stored usage data in either one of the memory devices.

29. A process for helping to prevent a measuring apparatus from losing accumulated usage data as in claim 27, wherein said dual storage double buffering technique includes retrieving stored usage data on demand by first determining whether any checksum errors exist and then deciding which memory device has the higher value valid usage data, and then retrieving such higher value valid data.

30. A process for helping to prevent a measuring apparatus from losing accumulated usage data as in claim 27, wherein said dual storage double buffering technique includes indicating a need for scheduled maintenance of the measuring apparatus if checksum errors are shown for each of the memory devices.

31. A process for helping to prevent a measuring apparatus from losing accumulated usage data as in claim 26, wherein said measuring apparatus includes electronic metrology means for generating usage data for consumption of a utility commodity, and said memory devices comprise respective non-volatile memory storage devices.

32. A process for helping to prevent a measuring apparatus from losing accumulated usage data as in claim 31, wherein said dual storage double buffering technique is operative implemented in a programmable device with associated software.

33. A process for helping to prevent a measuring apparatus from losing accumulated usage data as in claim 31, wherein said utility commodity is electricity and said units of measurement coincide with one of a certain unit of energy for a kWh reading and a unit of time for a kW reading.

34. A process for helping to prevent a measuring apparatus from losing accumulated usage data as in claim 33, wherein said utility commodity is one of electricity, water, gas and oil.

35. In a solid state electronic meter for monitoring electrical power consumption from an associated power line, a methodology for improving preservation of usage data without regard to power outages or variances and without having to detect such power outages or variances and without having to delay the onset thereof to such electronic meter, comprising:

providing an electronic metrology device for indicating sensed values of associated power line electrical power consumption; and providing a pair of non-volatile memory devices and associated software-based read/write logic for operatively controlling read and write operations relative to such memory devices per a memory integrity algorithm for double buffering stored sensed values from the electronic metrology device such that upon successful completion of successive write operations, any subsequent loss of usage data is limited to a predetermined unit of measurement controlled by the read/write logic, wherein said memory integrity algorithm includes during write operations thereof comparing sensed values stored in said pair of memory devices and replacing any relatively lower determined sensed value usage data with the next available new usage data generated by said electronic metrology device.

36. In a solid state electronic meter, a methodology as in claim 35, wherein said predetermined unit of measurement coincides with one of a certain unit of energy for a kWh reading and a unit of time for a kW reading.

37. In a solid state electronic meter, a methodology as in claim 35, wherein:

the non-volatile memory devices each comprise one of an EEPROM, a FLASH memory device, a magnetic medium, and a battery backed RAM; and the memory devices are located one of internally or externally to the electronic metrology device.

38. In a solid state electronic meter, a methodology as in claim 35, wherein the memory integrity algorithm includes during write operations thereof determining the existence of one of a rollover or reset condition if the sensed value of the next available new usage data is the same as or lower than sensed values stored in the pair or memory devices, and thereafter replacing the sensed value of such next available new usage data into each of the memory devices.

39. In a solid state electronic meter, a methodology as in claim 35, wherein the memory integrity algorithm includes during read operations thereof retrieving usage data on demand by first determining whether any checksum errors exist associated with either of the memory devices and then deciding which memory device has the higher sensed value valid usage data, and then retrieving such higher value valid data.

40. In a solid state electronic meter, a methodology as in claim 35, wherein the memory integrity algorithm includes during write operations thereof monitoring the sensed values stored in the memory devices for potential errors in checksum values respectively associated therewith, and for replacing the sensed values in both of the memory devices with the next available new sensed values of usage data indicated by the electronic metrology device if at least one of the monitored checksum values is found to be in error.

41. In a solid state electronic meter, a methodology as in claim 40, wherein the memory integrity algorithm further includes during write or read operations thereof indicating needed scheduled maintenance for the associated solid state electronic meter if monitoring shows checksum errors associated with both of the memory devices.

\* \* \* \* \*